United States Patent
Kim et al.

(10) Patent No.: US 10,198,201 B2
(45) Date of Patent: Feb. 5, 2019

(54) SEMICONDUCTOR APPARATUS, MEMORY SYSTEM AND REPAIR METHOD THEREOF

(71) Applicant: SK hynix Inc., Icheon-si, Gyeonggi-do OT (KR)

(72) Inventors: Dae Suk Kim, Icheon-si (KR); Young Jun Ku, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 101 days.

(21) Appl. No.: 15/416,405

(22) Filed: Jan. 26, 2017

(65) Prior Publication Data

US 2018/0011645 A1    Jan. 11, 2018

(30) Foreign Application Priority Data

Jul. 5, 2016    (KR) .................. 10-2016-0084684

(51) Int. Cl.
```
G11C 29/52    (2006.01)
G06F 3/06     (2006.01)
G11C 29/12    (2006.01)
G11C 29/00    (2006.01)
```
(52) U.S. Cl.
CPC .......... *G06F 3/0619* (2013.01); *G06F 3/065* (2013.01); *G06F 3/067* (2013.01); *G11C 29/12* (2013.01); *G11C 29/787* (2013.01)

(58) Field of Classification Search
CPC .................................................. G11C 29/52
USPC ...................................................... 365/200
See application file for complete search history.

(56) References Cited

U.S. PATENT DOCUMENTS

| | | | |
|---|---|---|---|
| 5,901,093 A | 5/1999 | Hiltebeitel et al. | |
| 6,553,510 B1* | 4/2003 | Pekny | G11C 29/78 714/6.12 |
| 2002/0159310 A1* | 10/2002 | Park | G11C 29/44 365/200 |
| 2004/0145939 A1* | 7/2004 | Yoshida | G11C 29/028 365/145 |
| 2010/0037014 A1* | 2/2010 | Lim | G11C 7/22 711/105 |
| 2013/0336060 A1* | 12/2013 | Arakawa | G11C 16/06 365/185.09 |
| 2014/0337573 A1* | 11/2014 | Chai | G06F 3/0689 711/114 |

FOREIGN PATENT DOCUMENTS

KR    1020020030183 A    4/2002

* cited by examiner

*Primary Examiner* — Min Huang
(74) *Attorney, Agent, or Firm* — William Park & Associates Ltd.

(57) ABSTRACT

A semiconductor apparatus may include a fuse cell array, an address generation circuit, a control circuit, and a command generation circuit. The fuse cell array may store a fail address. The address generation circuit may generate a copy address according to test information containing the fail address. The control circuit may control a repair operation including enabling a copy start signal according to the test information and storing the fail address in the fuse cell array according to a copy done signal. The command generation circuit may generate an address and a plurality of commands for a data copy operation according to the copy start signal and enable the copy done signal when the data copy operation is completed.

19 Claims, 3 Drawing Sheets

SEMICONDUCTOR APPARATUS, MEMORY SYSTEM AND REPAIR METHOD THEREOF

CROSS-REFERENCES TO RELATED APPLICATION

The present application claims priority under 35 U.S.C. § 119(a) to Korean application number 10-2016-0084684 filed on Jul. 5, 2016, in the Korean Intellectual Property Office, which is incorporated herein by reference in its entirety.

BACKGROUND

1. Technical Field

Various embodiments generally relate to a semiconductor circuit, and more particularly to a semiconductor apparatus, a memory system, and a repair method thereof.

2. Related Art

A semiconductor apparatus may include memory elements such as row and column lines, and memory cells coupled to the row and column lines. If some memory elements in the semiconductor apparatus are identified as being defective, such defective memory elements can be replaced with extra memory elements included in the semiconductor apparatus by a repair operation. The extra memory elements may include extra row and column lines, and extra memory cells. These extra memory elements may also be referred to as redundant elements.

In general, the repair operation replaces the entire row or column lines. Defects may occur not only at row and column lines, but also at memory cells. However, the repair operation replaces the row or column lines corresponding to memory cell locations identified as being defective even if only a small number of memory cells coupled to the row or column lines are defective.

Thus, data stored in normal memory cells other than the defective memory cells may be lost by the repair operation.

SUMMARY

In an embodiment of the present disclosure, a semiconductor apparatus may include a fuse cell array, an address generation circuit, a control circuit, and a command generation circuit. The fuse cell array may store a fail address. The address generation circuit may generate a copy address according to test information containing the fail address. The control circuit may control a repair operation including enabling a copy start signal according to the test information and storing the fail address in the fuse cell array according to a copy done signal. The command generation circuit may generate an address and a plurality of commands for a data copy operation according to the copy start signal and enable the copy done signal when the data copy operation is done.

In an embodiment of the present disclosure, a memory system may include a memory apparatus and a memory controller. The memory apparatus may perform a data copy operation including copying data stored in normal memory cells coupled to a word line corresponding to a fail address into redundant memory cells provided to store the data read out from the normal memory cells coupled to the word line corresponding to the fail address and then perform a repair operation including writing the fail address to a fuse cell array during a repair operation period. The memory controller may control the memory apparatus.

In an embodiment of the present disclosure, a repair method of a semiconductor apparatus may include receiving a fail address according to a test result, performing a data copy operation of copying data of all normal memory cells coupled to a word line corresponding to the fail address into redundant memory cells coupled to a redundant word line selected to store the data stored in normal memory cells coupled to the word line, and performing a repair operation including writing the fail address to a fuse cell array when the data copy operation is completed.

BRIEF DESCRIPTION OF THE DRAWINGS

Features, aspects, and embodiments are described in conjunction with the attached drawings, in which.

DETAILED DESCRIPTION

Hereinafter, a semiconductor apparatus, a memory system and a repair method thereof according to an embodiment of the present disclosure will be described below with reference to the accompanying drawings.

Figure 1:
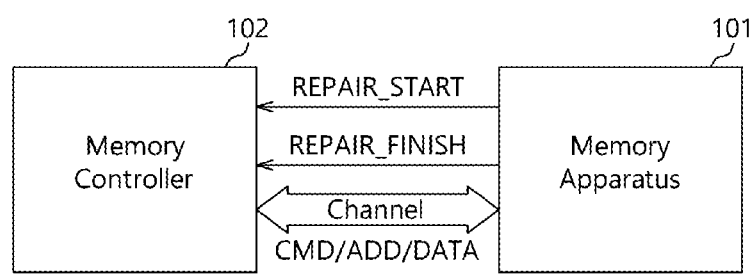
FIG. 1 is a diagram illustrating an example configuration of a memory system according to an embodiment.

As illustrated in FIG. 1, a memory system 100 according to an embodiment may include a memory apparatus 101 and a memory controller 102.

The memory controller 102 may provide a command CMD/address ADD/data DATA to the memory apparatus 101 through a channel, or may receive data from the memory apparatus 101.

In the event that a repair start signal REPAIR_START is issued, the memory controller 102 may recognize that the memory apparatus 101 start to perform a repair operation.

When the memory apparatus 101 is performing a repair operation, the memory controller 102 may stop providing a normal operation command to the memory apparatus 101.

In the event that a repair finish signal REPAIR_FINISH is issued, the memory controller 102 may recognize that the repair operation of the memory apparatus 101 has been finished.

If the repair operation of the memory apparatus 101 has been finished, and the memory controller 102 may start providing a normal operation command to the memory apparatus 101.

The memory controller 102 may perform a test on the memory apparatus 101, and may provide a test result to the memory apparatus 101.

The memory controller 102 may request data corresponding to address information of redundant memory cells from the memory apparatus 101, using the address information provided from the memory apparatus 101.

The memory controller 102 may provide a new type of command, for example, a copy data read command having no specific address designated thereto to the memory apparatus 101, regardless of the repair finish signal REPAIR_FINISH.

When a repair operation period begins, the memory apparatus 101 may perform a data copy operation before actually performing the repair operation. The data copy operation may include copying data stored in all memory cells coupled to a word line subject to the repair operation (e.g., a word line corresponding to a fail address) into a redundant memory cell assigned to the fail address.

Figure 4:
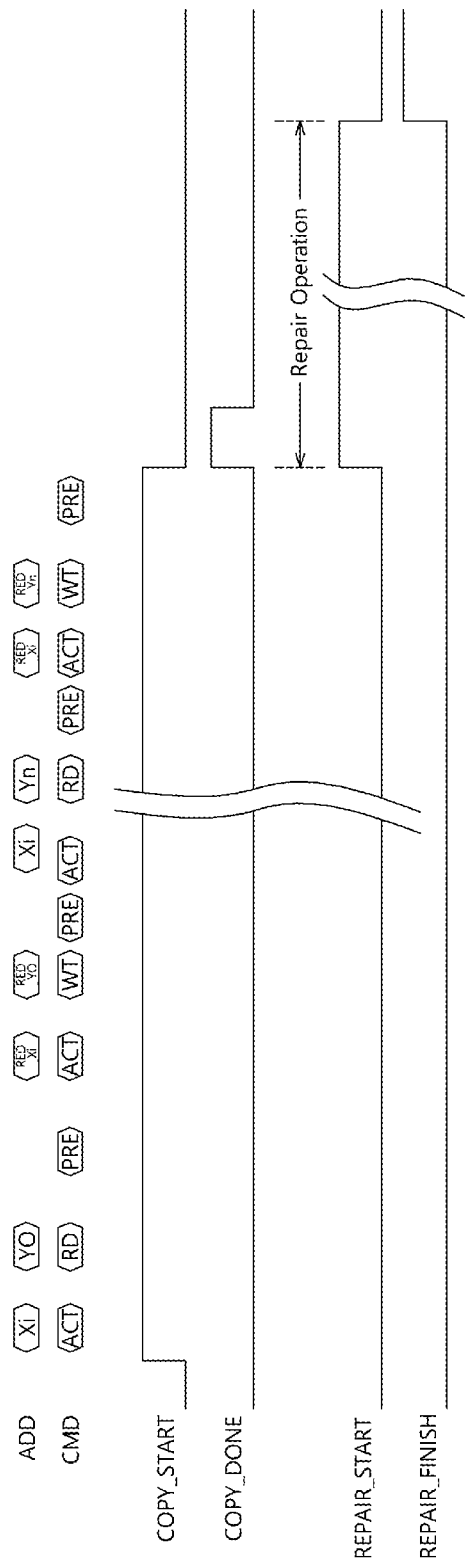
FIG. 4 is a timing diagram illustrating signals for a data processing method during a repair operation according to an embodiment.

The repair operation may include an operation of writing a fail address to a fuse cell array, which will be described with reference to FIG. 4.

The memory apparatus 101 may generate the repair start signal REPAIR_START to inform the memory controller 102 that a repair operation thereof is performed.

When the repair operation is finished, the memory apparatus 101 may generate the repair finish signal REPAIR_FINISH to inform the memory controller 102 that the repair operation thereof has been finished.

The memory apparatus 101 may provide the repair finish signal REPAIR_FINISH and information regarding the positions of data copied into the redundant memory cells through the data copy operation (i.e., the address information of the redundant memory cells) to the memory controller 102.

Since the memory apparatus 101 is aware of the address information of the data stored through the data copy operation, the memory apparatus 101 may provide the corresponding data to the memory controller 102, according to the copy data read command output from the memory controller 102.

Figure 2:
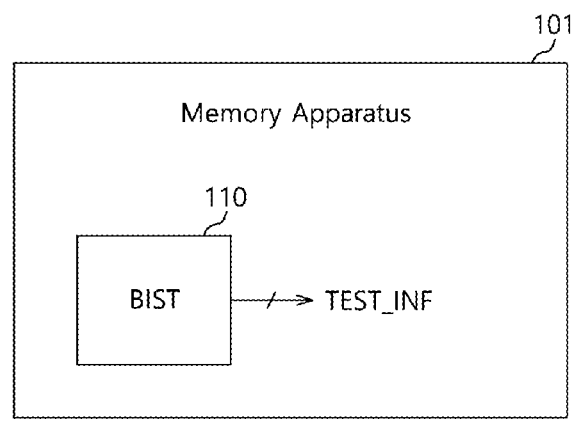
FIG. 2 is a diagram illustrating a method of a memory apparatus for providing test information according to an embodiment.

As illustrated in FIG. 2, the memory apparatus 101 may perform a test on the memory cells thereof through a BIST (Built-in Self Test) circuit 110 thereof, and may receive test information TEST_INF as a result of the test.

The test information TEST_INT may include a fail address.

The memory apparatus 101 may receive the test information TEST_INF from the memory controller 102.

Figure 3:
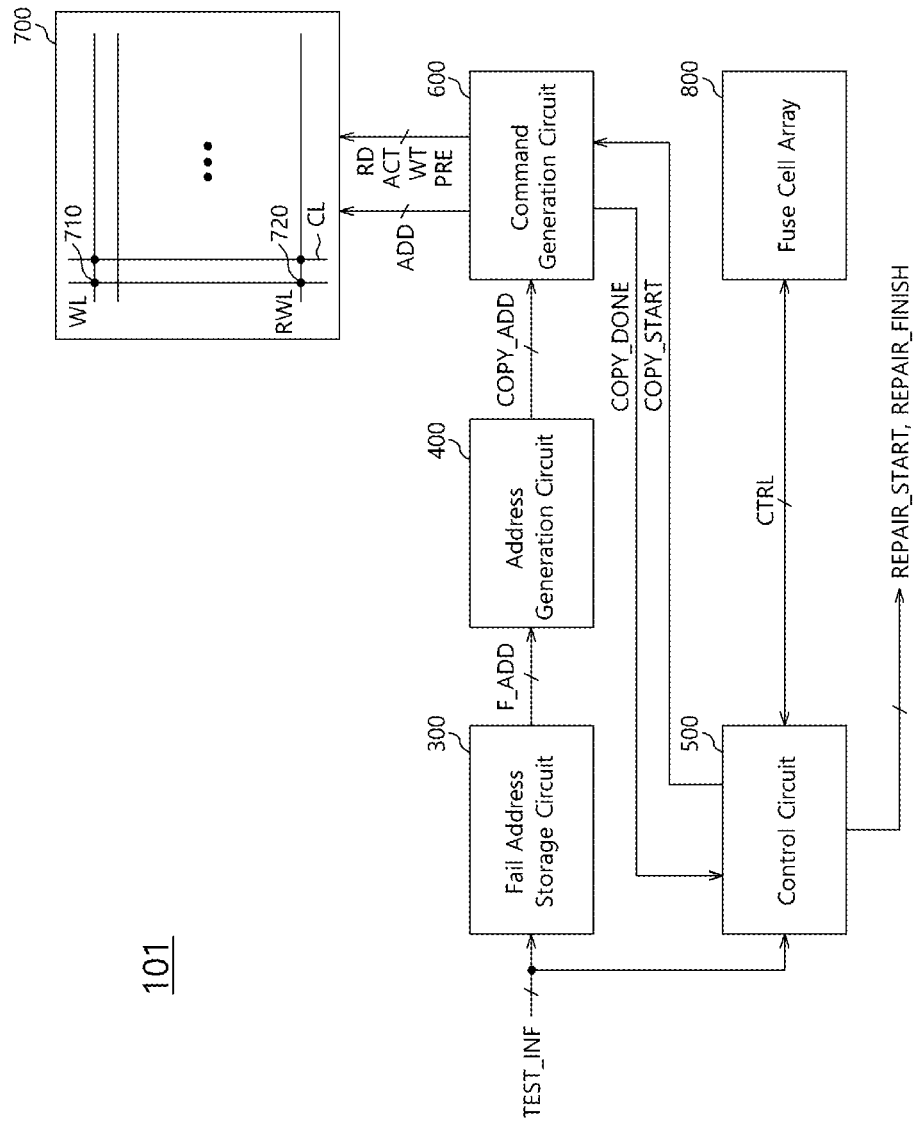
FIG. 3 is a diagram illustrating an example configuration of the memory apparatus according to an embodiment.

As illustrated in FIG. 3, the memory apparatus 101 may include a fail address storage circuit 300, an address generation circuit 400, a control circuit 500, a command generation circuit 600, a memory cell array 700, and a fuse cell array 800.

The memory cell array 700 may include a plurality of normal memory cells 710, a plurality of word lines WL coupled to the plurality of normal memory cells 710, a plurality of redundant memory cells 720, a plurality of redundant word lines RWL coupled to the plurality of redundant memory cells 720, and a plurality of column lines CL.

The memory cell array 700 may perform various operations such as a read operation, an active operation, a write operation, and a precharge operation on a normal memory cell 710 and redundant memory cell 720 corresponding to an address ADD, according to a plurality of commands RD, ACT, WT and PRE.

Among the plurality of commands RD, ACT, WT and PRE, "RD" may represent a read command, "ACT" may represent a row active command, "WT" may represent a write command, and "PRE" may represent a precharge command.

As described with reference to FIG. 3, the fail address storage circuit 300 may store and output a fail address F_ADD included in test information TEST_INF provided from the memory controller 102 or the BIST circuit 110.

The address generation circuit 400 may generate a copy address COPY_ADD corresponding to normal memory cells 710 coupled to row or column lines corresponding to the fail address F_ADD (i.e., row or column lines subject to the repair operation).

The copy address COPY_ADD may include a row address included in the fail address F_ADD and all column addresses corresponding to the row address.

The fuse cell array 800 may include electronic fuses (E-fuses).

The fuse cell array 800 may rupture an E-fuse to write the fail address F_ADD during a repair operation process.

The control circuit 500 may enable a copy start signal COPY_START according to the test information TEST_INF.

The control circuit 500 may disable the copy start signal COPY_START and enable the repair start signal REPAIR_START, according to a copy done signal COPY_DONE.

After enabling the repair start signal REPAIR_START, the control circuit 500 may control the fuse cell array 800 using one or more control signals CTRL during a predetermined time period, thereby performing a repair operation to write the fail address F_ADD.

When the repair operation is finished, the control circuit 500 may disable the repair start signal REPAIR_START and enable the repair finish signal REPAIR_FINISH.

The command generation circuit 600 may generate an address ADD and a plurality of commands RD, ACT, WT and PRE for performing a data copy operation according a copy start signal COPY_START. The data copy operation may include copying data stored in normal memory cells 710 corresponding to the copy address COPY_ADD into the redundant memory cells 720 selected to store the data stored in the normal memory cells 710.

As described above, the copy address COPY_ADD may include a row address included in the fail address F_ADD and all column addresses corresponding to the row address.

Thus, the command generation circuit 600 may sequentially output a row address and all column addresses corresponding to the row address as the respective addresses ADD.

Whenever each of the addresses ADD is output, the command generation circuit 600 may generate the plurality of commands RD, ACT, WT and PRE according to a predetermined order such that the data stored in the normal memory cell 710 corresponding to the address ADD is copied to the redundant memory cell 720 rather than output to an external device.

The command generation circuit 600 may enable the copy done signal COPY_DONE when the data copy operation for the copy address COPY_ADD has been completed.

Hereafter, a repair method according to an embodiment will be described with reference to FIGS. 1 to 4.

First, a test may be performed during a predetermined time period of the operation process of the memory system 100 (e.g., a system initialization process), and the test information TEST_INF may be generated as a result of the test.

That is, the memory controller 102 of FIG. 1 or the BIST circuit 110 of FIG. 2 may generate the test information TEST_INF.

According to a fail address F_ADD included in the test information TEST_INF, a copy address COPY_ADD may be generated.

The control circuit 500 may enable a copy start signal COPY_START according to the test information TEST_INF.

As the copy start signal COPY_START is enabled, the command generation circuit 600 may generate an address ADD and a plurality of commands RD, ACT, WT and PRE according to a predetermined order.

First, the command generation circuit 600 may generate an active command ACT for a row address Xi identified as having a defective element.

The memory cell array 700 may activate a word line WL corresponding to the row address Xi having the defective element.

The command generation circuit 600 may sequentially generate the read command RD and the precharge command RPE with a column address Y0, such that data of a normal memory cell 710 belonging to the first column of the activated word line WL is output.

The memory cell array 700 may output the data of the normal memory cell 710 corresponding to the row address Xi and the column address Y0 according to the read command RD, and may perform a precharge operation according to the precharge command PRE.

Then, the command generation circuit 600 may generate an active command for a row address RED Xi corresponding to a redundant memory cell 720 into which the data output from the normal memory cell 710 according to the read command RD is to be copied.

The memory cell array 700 may activate a redundant word line RWL corresponding to the row address RED Xi.

The command generation circuit 600 may sequentially generate the write command WT and the precharge command PRE with a column address RED Y0, such that the data output from the normal memory cell 710 according to the read command RD is written to the redundant memory cell 720 selected to store the data stored in the normal memory cells 710. For example, the data output from the normal memory cell 710 according to the read command RD may be written to the redundant memory cell 720 corresponding to the first column of the activated redundant word line RWL.

The memory cell array 700 may write the data output from the normal memory cell 710 according to the read command RD to the redundant memory cell 720 corresponding to the row address RED Xi and the column address RED Y0 according to the write command WT, and then may perform a precharge operation according to the precharge command PRE.

As the above-described operation is repeated, the data of the normal memory cell 710 corresponding to the last column (e.g., column address Yn) of the word line WL corresponding to the row address Xi may be written to the redundant memory cell 720 corresponding to the last column (e.g., column address RED Yn) of the redundant word line RWL corresponding to the row address RED Xi, and then the data copy operation may be completed.

Subsequently, the command generation circuit 600 may activate the copy done signal COPY_DONE.

The control circuit 500 may disable the copy start signal COPY_START according to the copy done signal COPY_DONE, and may enable the repair start signal REPAIR_START.

After enabling the repair start signal REPAIR_START, the control circuit 500 may control the fuse cell array 800 through the control line 900 during a predetermined time period, in order to perform a repair operation on the fail address F_ADD.

When the repair operation is finished, the control circuit 500 may disable the repair start signal REPAIR_START and enable the repair finish signal REPAIR_FINISH.

The memory controller 102 of FIG. 2 may recognize that the memory apparatus 101 is performing a repair operation, according to the repair start signal REPAIR_START, and may wait without providing a normal operation command to the memory apparatus 101.

The memory controller 102 may recognize that the repair operation of the memory apparatus 101 has been finished, according to the repair finish signal REPAIR_FINISH.

Thus, the memory controller 102 may request, to the memory apparatus 101, data corresponding to address information of redundant memory cells, using the address information provided from the memory apparatus 101.

Even when the memory controller 102 does not receive the address information of the redundant memory cells from the memory apparatus 101, the memory controller 102 may provide a new type of command, for example, a copy data read command having no specific address designated thereto to the memory apparatus 101.

Since the memory apparatus 101 is aware of the address information of the data stored through the data copy operation, the memory apparatus 101 may provide the data to the memory controller 102 according to the copy data read command.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    a fuse cell array configured to store a fail address;
    an address generation circuit configured to generate a copy address according to test information containing the fail address;
    a control circuit configured to control a repair operation including enabling a copy start signal according to the test information and storing the fail address in the fuse cell array according to a copy done signal; and
    a command generation circuit configured to generate an address and a plurality of commands for a data copy operation according to the copy start signal and enable the copy done signal when the data copy operation is completed,
    wherein the control circuit enables a repair start signal provided to an external device of the semiconductor apparatus, as the copy done signal is enabled.

2. The semiconductor apparatus according to claim 1, wherein the copy address comprises an address of memory cells coupled to signal lines corresponding to the fail address.

3. The semiconductor apparatus according to claim 1, wherein the data copy operation comprises copying data stored in the normal memory cells corresponding to the copy address into redundant memory cells selected to store the data stored in the normal memory cells.

4. The semiconductor apparatus according to claim 1, further comprising a BIST (Built-in Self Test) circuit configured to generate the test information by performing a predetermined test.

5. The semiconductor apparatus according to claim 1, further comprising a fail address storage circuit configured to store and output the fail address contained in the test information.

6. The semiconductor apparatus according to claim 1, wherein the copy address comprises a row address contained in the fail address and column addresses corresponding to the row address.

7. A memory system comprising:
a memory apparatus configured to perform a data copy operation including copying data stored in normal memory cells coupled to a word line corresponding to a fail address into redundant memory cells provided to store the data read out from the normal memory cells coupled to the word line corresponding to the fail address and then perform a repair operation including writing the fail address to a fuse cell array during a repair operation period; and
a memory controller configured to control the memory apparatus.

8. The memory system according to claim 7, wherein the memory controller performs a test on the memory apparatus and provides the fail address identified through the test to the memory apparatus.

9. The memory system according to claim 7, wherein the memory apparatus provides a repair start signal indicating a start of the repair operation and a repair finish signal indicating a completion of the repair operation to the memory controller.

10. The memory system according to claim 9, wherein the memory controller stops providing a normal operation command to the memory apparatus according to the repair start signal, and starts providing the normal operation command to the memory apparatus according to the repair finish signal.

11. The memory system according to claim 7, wherein the memory apparatus provides address information of the redundant memory cells to the memory controller.

12. The memory system according to claim 7, wherein the memory controller provides a copy data read command having no address designated thereto to the memory apparatus, and the memory apparatus provides, to the memory controller, the data copied into the redundant memory cells according to the copy data read command.

13. The memory system according to claim 7, wherein the memory apparatus comprises:
the fuse cell array configured to store the fail address;
an address generation circuit configured to generate a copy address for designating the normal memory cells according to test information containing the fail address;
a control circuit configured to control a repair operation including enabling a copy start signal according to the test information and storing the fail address in the fuse cell array according to a copy done signal; and
a command generation circuit configured to generate an address and a plurality of commands for the data copy operation according to the copy start signal, and enable the copy done signal when the data copy operation is completed.

14. The memory system according to claim 13, wherein the memory apparatus further comprises a BIST circuit configured to generate the test information by performing a predetermined test.

15. The memory system according to claim 13, wherein the memory apparatus further comprises a fail address storage circuit configured to store and output the fail address contained in the test information.

16. The memory system according to claim 13, wherein the copy address comprises a row address included in the fail address and column addresses corresponding to the row address.

17. The memory system according to claim 13, wherein the control circuit enables a repair start signal as the copy done signal is enabled.

18. A repair method of a semiconductor apparatus, the method comprising:
receiving a fail address according to a test result;
performing a data copy operation including copying data stored in all normal memory cells coupled to a word line corresponding to the fail address into redundant memory cells coupled to a redundant word line selected to store the data stored in normal memory cells coupled to the word line;
performing a repair operation including writing the fail address to a fuse cell array when the data copy operation is completed;
providing, by a memory controller, a copy data read command having no address designated thereto to a memory apparatus; and
providing, by the memory apparatus, the data copied in the redundant memory cells to the memory controller according to the copy data read command.

19. The repair method according to claim 18, further comprising providing address information of the redundant memory cells to an external device.

* * * * *